(12) United States Patent
Park

(10) Patent No.: US 6,984,853 B2
(45) Date of Patent: Jan. 10, 2006

(54) INTEGRATED CIRCUIT WITH ENHANCEMENT MODE PSEUDOMORPHIC HIGH ELECTRON MOBILITY TRANSISTORS HAVING ON-CHIP ELECTROSTATIC DISCHARGE PROTECTION

(75) Inventor: Chul Hong Park, San Jose, CA (US)

(73) Assignee: Agilent Technologies, Inc, Palo Alto, CA (US)

( * ) Notice: Subject to any disclaimer, the term of this patent is extended or adjusted under 35 U.S.C. 154(b) by 13 days.

(21) Appl. No.: 10/789,301

(22) Filed: Feb. 26, 2004

(65) Prior Publication Data

US 2005/0189560 A1    Sep. 1, 2005

(51) Int. Cl.
 *H01L 29/739* (2006.01)
(52) U.S. Cl. .................. 257/194; 257/192; 438/167; 438/172
(58) Field of Classification Search ........ 257/192–195; 438/167, 172, 257
 See application file for complete search history.

(56) References Cited

U.S. PATENT DOCUMENTS

| 5,030,852 | A | * | 7/1991 | Higashisaka | 326/33 |
| 5,084,743 | A | * | 1/1992 | Mishra et al. | 257/487 |
| 5,304,825 | A | * | 4/1994 | Vaitkus et al. | 257/192 |
| 5,633,610 | A | * | 5/1997 | Maekawa et al. | 327/355 |
| 6,294,801 | B1 | * | 9/2001 | Inokuchi et al. | 257/192 |
| 6,537,865 | B2 | * | 3/2003 | Inokuchi et al. | 438/172 |

* cited by examiner

*Primary Examiner*—Allan R. Wilson

(57) ABSTRACT

An integrated circuit (IC) with high electron mobility transistors, such as enhancement mode pseudomorphic high electron mobility transistors (E-pHEMTs) and method for fabricating the IC utilizes an increased gate-to-drain etch recess spacing in some of the high electron mobility transistors to provide on-chip electrostatic discharge protection. The use of the increased gate-to-drain etch recess spacing allows smaller high electron mobility transistors to be used for ancillary low speed applications on the IC, which reduces the chip area occupied by these ancillary transistors.

20 Claims, 5 Drawing Sheets

INTEGRATED CIRCUIT WITH ENHANCEMENT MODE PSEUDOMORPHIC HIGH ELECTRON MOBILITY TRANSISTORS HAVING ON-CHIP ELECTROSTATIC DISCHARGE PROTECTION

BACKGROUND OF THE INVENTION

Enhancement mode pseudomorphic high electron mobility transistors (E-pHEMTs) provide operating properties suited for portable wireless applications, such as radio frequency applications. E-pHEMTs require less power to operate than other comparable devices, and consequently, can be used to produce power amplifiers with an exceptional power-added efficiency, which is a measure of how much power is needed to achieve a given amount of amplification. Furthermore, in contrast to other similar devices, E-pHEMTs can operate from a single positive voltage supply since the E-pHEMTs do not require negative gate voltage for control. Thus, E-pHEMTs can be operated without components that provide a negate voltage supply, which translates into decrease in system cost, reduced board space requirements and less complex system design. Due to these operating properties, E-pHEMTs are currently used in radio frequency integrated circuits (RFICs) for portable wireless devices, such as cellular phones.

An importance consideration for designing an RFIC with E-pHEMTs is on-chip electrostatic discharge (ESD) protection. In conventional silicon-based ICs, on-chip ESD protection may be provided by large ESD protection devices, such as capacitors or diode arrays that are specifically included in the ICs for ESD protection. However, due to the high costs associated with the manufacturing of RFICs with E-pHEMTs, the use of large on-chip ESD protection devices in the RFICs is not practical. Even if manufacturing costs are ignored, the demand for smaller RFICs prohibits the use of large on-chip ESD protection devices.

In view of these concerns, what is needed is an IC with E-pHEMTs having on-chip ESD protection and method for fabricating the IC without significantly increasing the overhead on the chip area for the ESD protection.

SUMMARY OF THE INVENTION

An integrated circuit (IC) with high electron mobility transistors, such as enhancement mode pseudomorphic high electron mobility transistors (E-pHEMTs) and method for fabricating the IC utilizes an increased gate-to-drain etch recess spacing in some of the high electron mobility transistors to provide on-chip electrostatic discharge (ESD) protection. The use of the increased gate-to-drain etch recess spacing allows smaller high electron mobility transistors to be used for ancillary low speed applications on the IC, which reduces the chip area occupied by these ancillary transistors.

An IC in accordance with an embodiment of the invention includes a substrate, and a high electron mobility transistor formed on the substrate. The high electron mobility transistor including a source electrode, a drain electrode and a gate electrode. The high electron mobility transistor has an increased gate-to-drain etch recess spacing, which provides a greater protection for the high electron mobility transistor from an ESD on the drain electrode. In an embodiment, the increased gate-to-drain etch recess spacing is wider than a gate-to-drain etch recess spacing of a primary high electron mobility transistor formed on the substrate on a signal path between an input node and an output node.

A method for fabricating an integrated circuit with at least one high electron mobility transistor includes proving a substrate, and forming a high electron mobility transistor with a source electrode, a drain electrode and a gate electrode on the substrate. The forming of the high electron mobility transistor includes creating an increased gate-to-drain etch recess spacing. The increased gate-to-drain etch recess spacing provides a greater protection for the high electron mobility transistor from an ESD on the drain electrode.

Other aspects and advantages of the present invention will become apparent from the following detailed description, taken in conjunction with the accompanying drawings, illustrated by way of example of the principles of the invention.

DETAILED DESCRIPTION

Figure 1:
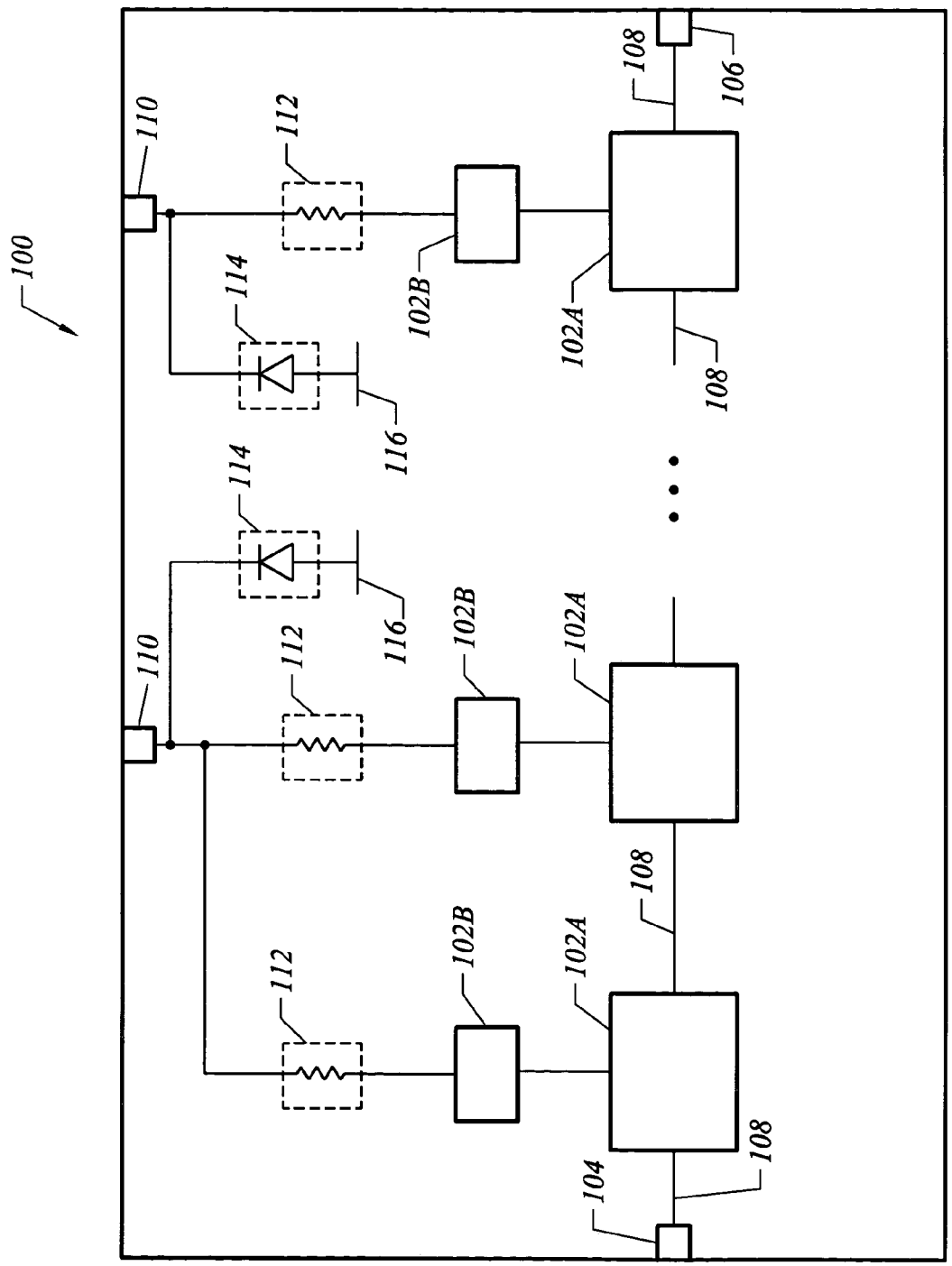
FIG. 1 is a diagram of an integrated circuit (IC) with enhancement mode pseudomorphic high electron mobility transistors (E-pHEMTs) having on-chip electrostatic discharge (ESD) protection in accordance with an embodiment of the invention.

With reference to FIG. 1, an integrated circuit (IC) 100 with enhancement mode pseudomorphic high-electron mobility transistors (E-pHEMTs) 102A and 102B in accordance with an embodiment of the invention is described. As an example, the IC 100 may be a radio frequency (RF) IC such as a power amplifier RFIC for amplification of RF signals. However, the IC 100 may be any type of IC with any functionality or functionalities. As described in more detail below, the IC 100 has on-chip electrostatic discharge (ESD) protection that minimizes the use of chip area for the ESD protection.

The IC 100 includes an input node 104 that receives input signals, such as input RF signals, and an output node 106 that transmits output signals, such as amplified RF signals. The IC further 100 includes a number of active components in the form of E-pHEMTs 102A and 102B. Some of these E-pHEMTs are located on a signal path 108 from the input node 104 to the output node 106. These E-pHEMTs 102A are referred to herein as primary E-pHEMTs. The primary E-pHEMTs 102A operate on the received input signals. Thus, the performance of these primary E-pHEMTs 102A with respect to speed directly impacts the overall performance of the IC 100. However, other E-pHEMTs 102B of the IC 100 are not located on the signal path 108. These E-pHEMTs 102B are ancillary devices that may be used for DC buffer, voltage/current detection, or other relatively low speed applications, such as providing certain conditions for the primary E-pHEMTs 102A, e.g., bias voltage. Consequently, these ancillary E-pHEMTs 102B do not require optimal performance, and thus, do not have to be as large as the primary E-pHEMTs 102A. As illustrated in FIG. 1, one or more ancillary E-pHEMTs 102B are typically connected to a contact pin 110 of the IC 100, which provides an electrical connection between the IC and the module board (not shown) on which the IC is to be mounted.

The maximum level of ESD that can be handled by an E-pHEMT is dependent on the size of that E-pHEMT. Larger E-pHEMTs can withstand stronger ESD. However, to minimize the size of an IC, ancillary E-pHEMTs should be made as small as possible. Thus, the ancillary E-pHEMTs of conventional ICs are more vulnerable to ESD. In view of the IC size minimization requirement and the ESD vulnerability of smaller E-pHEMTs, the ancillary E-pHEMTs 102B of the IC 100 are designed to withstand stronger ESD while minimizing the use of chip area for the ESD protection.

Figure 2:
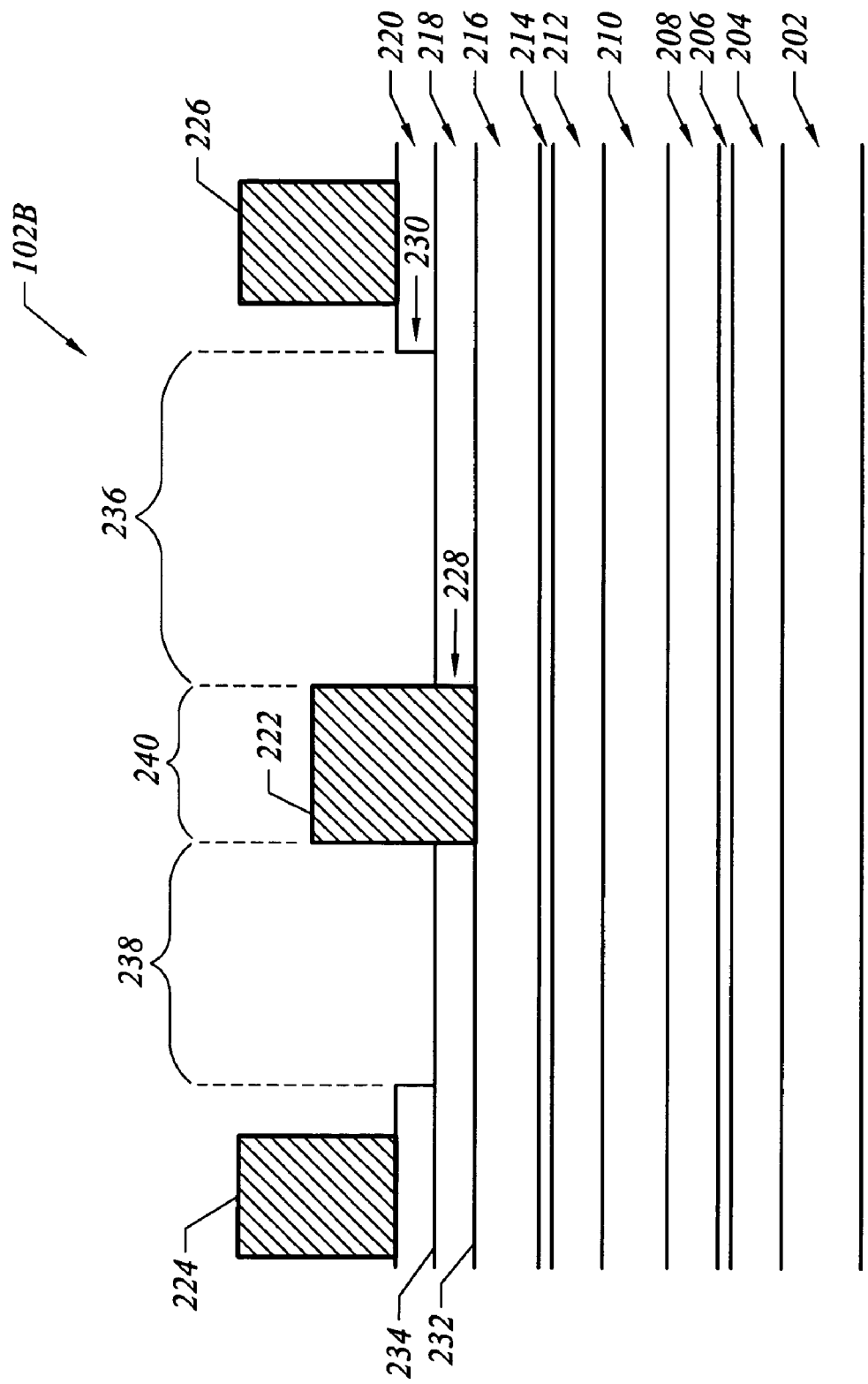
FIG. 2 is a cross-sectional view of an ancillary E-pHEMT included in the IC of FIG. 1 in accordance with an embodiment of the invention.

Turning now to FIG. 2, a cross-section of one of the ancillary E-pHEMTs 102B in accordance with an embodiment of the invention is shown. The ancillary E-pHEMT 102B is formed on a substrate 202, which is an insulating gallium arsenide (GaAs) substrate. The ancillary E-pHEMT 102B includes a buffer layer 204, a first silicon (Si) doped aluminum gallium arsenide (AlGaAs) layer 206, a first spacer layer 208, a channel layer 210, a second spacer layer 212, a second Si doped AlGaAs layer 214, a Schottky layer 216, an undoped GaAs layer 218 and a cap layer 220. These layers can be found in conventional E-pHEMTs, and thus, are not described in detail herein.

The buffer layer 204 can be a layer of GaAs or alternating layers of GaAs and AlGaAs. The buffer layer 204 is used to create a smooth surface to grow subsequent layers of the E-pHEMT 102B over the buffer layer. The spacer layers 208 and 212 can be made of undoped AlGaAs. The channel layer 210 is made of undoped indium gallium arsenide (InGaAs). The Schottky layer 216 is made of undoped AlGaAs. The cap layer 220 is made of highly doped GaAs.

The ancillary E-pHEMT 102B further includes a gate electrode 222 formed on the Schottky layer 216, and a source electrode 224 and a drain electrode 226 formed on the cap layer 220. In order for the gate electrode 222 to be formed on the Schottky layer 216, the undoped GaAs layer 218 over the Schottky layer includes an etched recess 228, allowing the gate electrode to contact the Schottky layer through the undoped GaAs layer. The spacing of this etched recess 228 is referred to herein as the gate etch recess spacing. The cap layer 220 also includes an etched recess 230 that provides spacing between the gate electrode and the etched edges of the cap layer. The etched recess 228 of the undoped GaAs layer 218 is formed using an etch stop 232 on the Schottky layer 216, while the etched recess 230 of the cap layer 220 is formed using an etch stop 234 on the undoped GaAs layer 218. The etch stops 232 and 234 can be thin layers of aluminum arsenide (AlAs) or AlGaAs. The distance between the gate electrode 222 and the etched edge of the cap layer 220 adjacent to the drain electrode 226 is referred to herein as the gate-to-drain etch recess spacing 236. Similarly, the distance between the gate electrode 222 and the etched edge of the cap layer 220 adjacent to the source electrode 224 is referred to herein as the gate-to-source etch recess spacing 238. These etch recess spacings 236 and 238 provide the necessary distance between the gate electrode 222 and the drain and source electrodes 224 and 226 to prevent electrical short through the E-pHEMT 102B during operation when large voltage swings between the gate electrode and the drain electrode are possible.

The ancillary E-pHEMT 102B of FIG. 2 is structurally similar to the primary E-pHEMTs 102A and other comparable conventional E-pHEMTs with respect to device size. However, the gate-to-drain etch recess spacing 236 of the ancillary E-pHEMT 102B is increased in comparison with the gate-to-drain etch recess spacing of the primary E-pHEMTs 102A and the comparable conventional E-pHEMTs. The gate-to-drain etch recess spacing of the E-pHEMTs 102A and the comparable conventional E-pHEMTs is typically less than one (1) micron ($\mu$m), while the increased gate-to-drain etch recess spacing 236 of the E-pHEMT 102B is preferably between four (4) to ten (10) microns. This increased gate-to-drain etch recess spacing 236 in the E-pHEMT 102B results in a greater protection from positive ESD on the drain electrode 226. As a result, the E-pHEMT 102B is protected from higher levels of positive ESD than the comparable conventional E-pHEMTs. That is, the increase in gate-to-drain etch recess spacing 236 allows the E-pHEMT 102B to be protected from positive ESD that would have otherwise damaged the E-pHEMT, as is the case for the conventional E-pHEMTs.

As stated above, the preferred range for the gate-to-drain etch recess spacing 236 in the E-pHEMT 102B is four (4) to ten (10) microns, depending on the desired maximum level of positive ESD that can be handled by the E-pHEMT. As an example, for protection up to seventy (70) volts of ESD, the gate-to-drain etch recess spacing 236 in the E-pHEMT 102B may be five (5) microns. As another example, for protection up to one hundred (100) volts of ESD, the gate-to-drain etch recess spacing 236 in the E-pHEMT 102B may be eight (8) or nine (9) microns. However, the gate-to-drain etch recess spacing 236 can be narrower than four (4) microns or wider than ten (10) microns.

Figure 3:
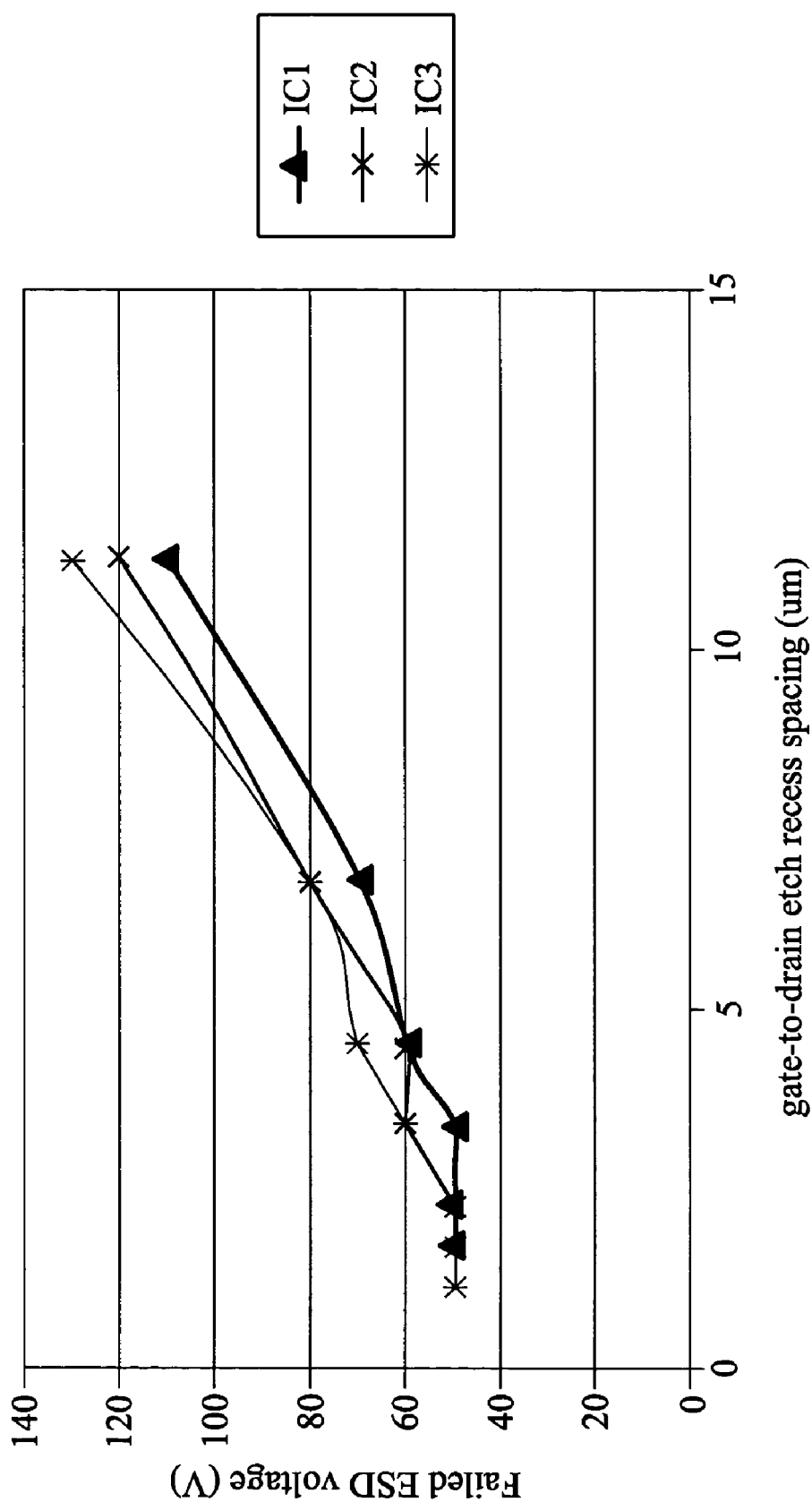
FIG. 3 is a graph of failed ESD voltage versus gate-to-drain etch recess spacing for three ICs in accordance with an embodiment of the invention.

In FIG. 3, a graph of failed ESD voltage versus gate-to-drain etch recess spacing for three ICs with ancillary E-pHEMTs, such as the E-pHEMT 102B of FIG. 2, in accordance with an embodiment of the invention is shown. The failed ESD voltage refers to the ESD voltage at which an IC failure occurs due the ancillary E-pHEMT damage from the ESD voltage. As illustrated in the graph of FIG. 3, the failed ESD voltage increases as the gate-to-drain etch recess spacing is increased. Thus, E-pHEMTs with wider gate-to-drain etch recess spacing can withstand stronger positive ESD.

In addition to the increased gate-to-drain etch recess spacing 236 in the ancillary E-pHEMT 102B of FIG. 2 to provide greater positive ESD protection, the width 240 of the gate electrode 222 of the ancillary E-pHEMT is also increased in comparison with the width of the gate electrodes of the primary E-pHEMTs 102A and other comparable conventional E-pHEMTs. Consequently, the gate etch recess spacing 228 of the ancillary E-pHEMT 102B is also increased to accommodate the increased gate width 240. The increased width 240 of the gate electrode 222 provides greater negative ESD protection. Device failure of an E-pHEMT from negative ESD is primarily due to the high current density through a Schottky diode of the E-pHEMT via the gate electrode. Thus, by increasing the width 240 of the gate electrode 222, the Schottky diode of the ancillary E-pHEMT 102B is enlarged and the current through the diode is more evenly distributed. Therefore, the current density through the gate electrode 222 is reduced for a given current. As a result, the E-pHEMT 102B is able to handle more current, and thus, is protected from stronger negative ESD.

The fabrication of the ancillary E-pHEMTs 102B of the IC 100 involves the same fabrication processes of similar conventional E-pHEMTs. However, the etched recesses 228 and the 230 are made larger to accommodate the gate electrodes 222 with the increased widths 240 and to increase the gate-to-drain etch recess spacings 236 of the E-pHEMTs 102B.

Turning back to FIG. 1, the IC 100 may employ other optional negative ESD protection features. As shown in FIG. 1, the IC 100 may include optional resistors 112 that are connected to the drain electrodes 226 of the ancillary E-pHEMTs 102B and the respective contact pins 110. The resistors 112 are made of a semiconductor material, and thus, function as current limiters to limit the amount of current conducted through the respective Schottky diodes of the ancillary E-pHEMTs 102B in the presence of ESD. As a result, the ancillary E-pHEMTs 102B are able to withstand stronger negative ESD.

Also shown in FIG. 1 are optional reverse biased Schottky diodes 114 connected to low voltage terminals 116 and the contact pins 100. Thus, these reverse biased Schottky diodes 114 are connected to the respective drain electrodes 226 of the ancillary E-pHEMTs 102B. The Schottky diodes 114 operate to conduct most of the current caused by negative ESD. The Schottky diodes 114 are configured to turn on before the Schottky diodes of the ancillary E-pHEMTs 102B so that the ancillary E-pHEMTs are protected from the initial high ESD current.

Figure 4:
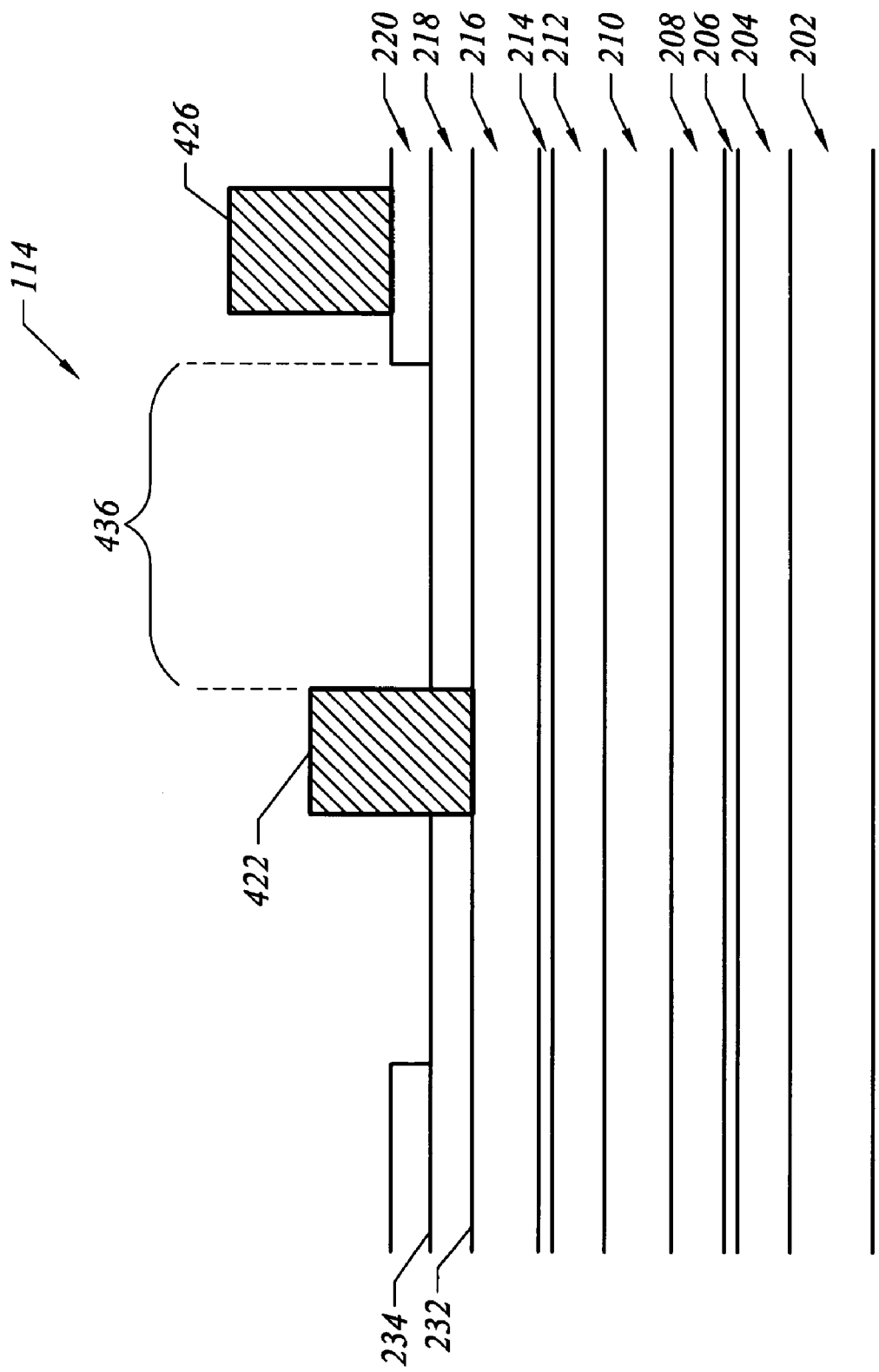
FIG. 4 is a cross-sectional view of an optional Schottky diode included in the IC of FIG. 1 for negative ESD protection in accordance with an embodiment of the invention.

Turning now to FIG. 4, a cross-sectional view of one of the Schottky diodes 114 in accordance with an embodiment of the invention is shown. The same reference numerals of FIG. 2 are used in FIG. 4 to reference similar components. In this illustrated embodiment, the Schottky diode 114 is similar to the ancillary E-pHEMT 102B of FIG. 2, except that there is no equivalent electrode in the Schottky diode for the source electrode 224 of the E-pHEMT.

As shown in FIG. 4, the Schottky diode 114 is formed over the substrate 202. The Schottky diode 114 includes the buffer layer 204, the first Si doped AlGaAs layer 206, the first spacer layer 208, the channel layer 210, the second spacer layer 212, the second Si doped AlGaAs layer 214, the Schottky layer 216, the undoped GaAs layer 218 and the cap layer 220. The Schottky diode 114 further includes an anode electrode 422 formed on the Schottky layer 216, and a cathode electrode 426 formed on the cap layer 226. The anode and cathode electrodes 422 and 426 of the Schottky diode 114 are essentially equivalent to the gate and drain electrodes 222 and 226 of the E-pHEMT 102B FIG. 2, respectively.

Similar to the ancillary E-pHEMT 102B of FIG. 2, the Schottky diode 114 of FIG. 4 is also vulnerable to positive ESD. Thus, the Schottky diode 114 can also benefit from positive ESD protection. The same approach for protecting the ancillary E-pHEMT 102B from positive ESD can be applied to the Schottky diode 114. Similar to the gate-to-drain etch recess spacing 236 in the E-pHEMT 102B, there is an anode-to-cathode etch recess spacing 436 in the Schottky diode 114. Consequently, increasing the anode-to-cathode etch recess spacing 436 in the Schottky diode 114 results in a greater protection of the Schottky diode 114 from positive ESD. Thus, the anode-to-cathode etch recess spacing 436 of the Schottky diode 114 is increased in comparison with the gate-to-drain etch recess spacing of the primary E-pHEMTs 102A and the anode-to-cathode etch recess spacing of other comparable Schottky diodes.

As stated above, the Schottky diode 114 should be designed to turn on before the ancillary E-pHEMT 102B to which that Schottky diode is connected. This can be achieved by using different types of materials for the anode and cathode electrodes 422 and 426 of the Schottky diode 114 in comparison with the materials used for the gate and drain electrodes 222 and 226 of the E-pHEMT 102B. Alternatively or in conjunction with different electrode materials, the anode and cathode electrodes 422 and 426 can be made to contact different layers of the Schottky diode 114 in comparison with the gate and drain electrodes 222 and 226 of the E-pHEMT 102B to structurally configure the Schottky diode to turn on before the E-pHEMT 102B.

Figure 5:
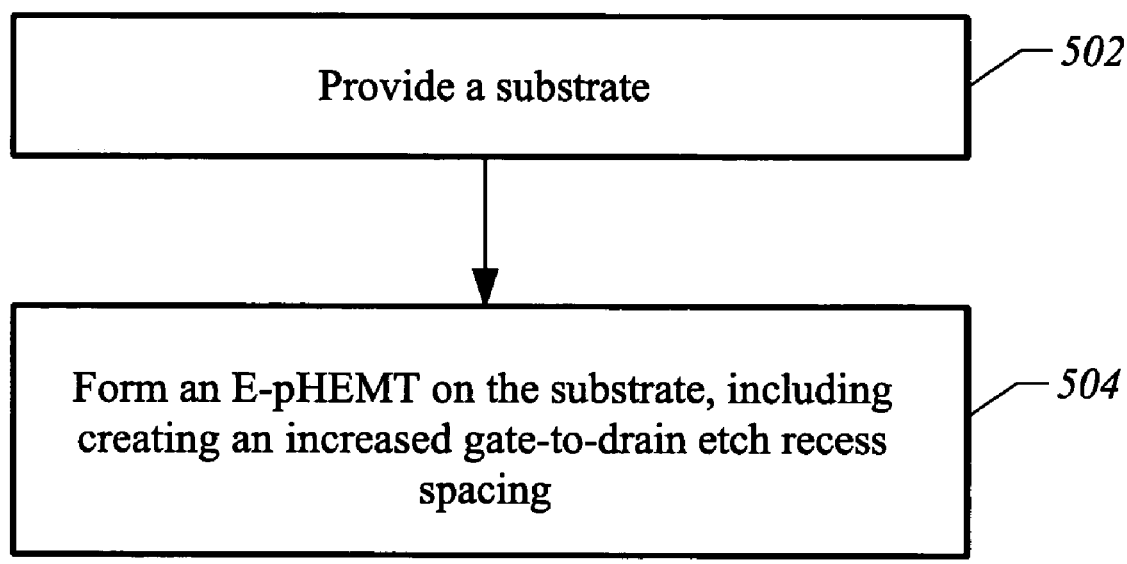
FIG. 5 is a flow diagram of a method for fabricating an integrated circuit with E-pHEMTs having on-chip ESD protection in accordance with an embodiment of the invention.

A method for fabricating an integrated circuit with E-pHEMTs in accordance with an embodiment of the invention is described with reference to a flow diagram of FIG. 5. At block 502, a substrate is provided. As an example, the substrate may be an insulating GaAs substrate. Next, at block 504, an E-pHEMT is formed on the substrate. The forming of the E-pHEMT includes forming different layers over the substrate. In an embodiment, these different layers may include a buffer layer, a first Si doped AlGaAs layer, a first spacer layer, a channel layer, a second spacer layer, a second Si doped AlGaAs layer, a Schottky layer, an undoped GaAs layer and a cap layer. The forming of the E-pHEMT further includes creating an increased gate-to-drain etch recess spacing, which provides a greater ESD protection for the E-pHEMT. The increased gate-to-drain etch recess spacing of the E-pHEMT is wider than the gate-to-drain etch recess spacing of a primary E-pHEMT formed on the substrate on a signal path between an input node and an output node. As an example, the increased gate-to-drain etch recess spacing of the E-pHEMT is at least four (4) microns. The gate-to-drain and gate-to-source etch recess spacings are created from an etched recess through the undoped GaAs layer, and are dependent on the width of a gate electrode formed on the Schottky layer, as well as the width of the etched recess.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An integrated circuit comprising:
   a substrate; and
   a high electron mobility transistor formed on the substrate, the high electron mobility transistor including a source electrode, a drain electrode and a gate electrode, the high electron mobility transistor having an increased gate-to-drain etch recess spacing, wherein the increased gate-to-drain etch recess spacing is at least four microns, the increased gate-to-drain etch recess spacing proving a greater protection for the high electron mobility transistor from an electrostatic discharge on the drain electrode.

2. The integrated circuit of claim 1 wherein the high electron mobility transistor includes an enhancement mode pseudomorphic high electron mobility transistor.

3. The integrated circuit of claim 1 further comprising a second high electron mobility transistor formed on the substrate on a signal path between an input node and an output node, the second high electron mobility transistor having a second gate-to-drain etch recess spacing, the gate-to-drain etch recess spacing of the high electron mobility transistor being wider than the second gate-to-drain etch recess spacing of the second high electron mobility transistor.

4. The integrated circuit of claim 3 wherein a width of the gate electrode of the high electron mobility transistor is wider than a width of a gate electrode of the second high electron mobility transistor.

5. The integrated circuit of claim 1 further comprising a resistor formed over the substrate connected to the drain electrode of the high electron mobility transistor, the resistor being made of a semiconductor material.

6. The integrated circuit of claim 1 further comprising a reverse biased Schottky diode formed over the substrate connected to the drain electrode of the high electron mobility transistor, the reverse biased Schottky diode being configured to have an increased anode-to-cathode etch recess spacing to provide protection for the reverse biased Schottky diode from a positive electrostatic discharge.

7. The integrated circuit of claim 6 wherein the reverse biased Schottky diode is structurally configured to turn on prior to the high electron mobility transistor when a negative electrostatic discharge is applied to the drain electrode of the high electron mobility transistor.

8. A method for fabricating an integrated circuit with at least one high electron mobility transistor, the method comprising:
proving a substrate; and
forming a high electron mobility transistor with a source electrode, a drain electrode and a gate electrode on the substrate, including creating an increased gate-to-drain etch recess spacing of at least four microns, the increased gate-to-drain etch recess spacing proving a greater protection for the high electron mobility transistor from an electrostatic discharge on the drain electrode.

9. The method of claim 8 wherein the forming of the high electron mobility transistor includes forming an enhancement mode pseudomorphic high electron mobility transistor on the substrate.

10. The method of claim 8 further comprising forming a second high electron mobility transistor on the substrate on a signal path between an input node and an output node, the second high electron mobility transistor having a second gate-to-drain etch recess spacing, the gate-to-drain etch recess spacing of the high electron mobility transistor being wider than the second gate-to-drain etch recess spacing of the second high electron mobility transistor.

11. The method of claim 10 wherein the forming the high electron mobility transistor includes creating the gate electrode with a width that is wider than a width of a gate electrode of the second high electron mobility transistor.

12. The method of claim 8 further comprising forming a resistor over the substrate connected to the drain electrode of the high electron mobility transistor, the resistor being made of a semiconductor material.

13. The method of claim 8 further comprising forming a reverse biased Schottky diode over the substrate connected to the drain electrode of the high electron mobility transistor, including creating an increased anode-to-cathode etch recess spacing to provide protection for the reverse biased Schottky diode from a positive electrostatic discharge.

14. An integrated circuit comprising:
an insulating substrate;
a first high electron mobility transistor formed on the insulating substrate, the first high electron mobility transistor having a first gate-to-drain etch recess spacing; and
a second high electron mobility transistor formed on the insulating substrate, the second high electron mobility transistor having a second gate-to-drain etch recess spacing that is wider than the first gate-to-drain etch recess spacing of the first high electron mobility transistor to provide a greater protection for the second high electron mobility transistor from an electrostatic discharge.

15. The integrated circuit of claim 14 wherein the second gate-to-drain etch recess spacing of the second high electron mobility transistor is at least four microns.

16. The integrated circuit of claim 14 wherein a width of a gate electrode of the second high electron mobility transistor is wider than a width of a gate electrode of the first high electron mobility transistor.

17. The integrated circuit of claim 14 further comprising a resistor formed over the substrate connected to a drain electrode of the second high electron mobility transistor, the resistor being made of a semiconductor material.

18. The integrated circuit of claim 14 further comprising a reverse biased Schottky diode formed over the insulating substrate connected to the second high electron mobility transistor, the reverse biased Schottky diode being configured to have an anode-to-cathode etch recess spacing that is wider than the first gate-to-drain etch recess spacing of the first high electron mobility transistor to provide protection for the reverse biased Schottky diode from the positive electrostatic discharge.

19. A method for fabricating an integrated circuit with at least one high electron mobility transistor, the method comprising:
proving a substrate;
forming a high electron mobility transistor with a source electrode, a drain electrode and a gate electrode on the substrate, including creating an increased gate-to-drain etch recess spacing, the increased gate-to-drain etch recess spacing proving a greater protection for the high electron mobility transistor from an electrostatic discharge on the drain electrode; and
forming a second high electron mobility transistor on the substrate on a signal path between an input node and an output node, the second high electron mobility transistor having a second gate-to-drain etch recess spacing, the gate-to-drain etch recess spacing of the high electron mobility transistor being wider than the second gate-to-drain etch recess spacing of the second high electron mobility transistor.

20. The method of claim 19 wherein the forming the high electron mobility transistor includes creating the gate electrode with a width that is wider than a width of a gate electrode of the second high electron mobility transistor.

* * * * *